(12) United States Patent
Ajmera et al.

(10) Patent No.: US 8,461,009 B2
(45) Date of Patent: Jun. 11, 2013

(54) SPACER AND PROCESS TO ENHANCE THE STRAIN IN THE CHANNEL WITH STRESS LINER

(75) Inventors: Atul C. Ajmera, Wappingers Falls, NY (US); Christopher V. Baiocco, Newburgh, NY (US); Xiangdong Chen, Poughquag, NY (US); Wenzhi Gao, Beacon, NY (US); Young Way Teh, Singapore (MY)

(73) Assignees: International Business Machines Corporation, Armonk, NY (US); Chartered Semiconductor Manufacturing Ltd., Singapore (MY)

( * ) Notice: Subject to any disclaimer, the term of this patent is extended or adjusted under 35 U.S.C. 154(b) by 1843 days.

(21) Appl. No.: 11/307,928

(22) Filed: Feb. 28, 2006

(65) Prior Publication Data
US 2007/0202654 A1 Aug. 30, 2007

(51) Int. Cl.
*H01L 21/336* (2006.01)

(52) U.S. Cl.
USPC 438/303; 438/900; 257/E21.64; 257/E21.205

(58) Field of Classification Search
USPC .......................................... 438/230, 265, 303
See application file for complete search history.

(56) References Cited

U.S. PATENT DOCUMENTS

| | | | |
|---|---|---|---|
| 3,602,841 A | 8/1971 | McGroddy | |
| 4,665,415 A | 5/1987 | Esaki et al. | |
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke | |
| 5,081,513 A | 1/1992 | Jackson et al. | |
| 5,108,843 A | 4/1992 | Ohtaka et al. | |
| 5,134,085 A | 7/1992 | Gilgen et al. | |
| 5,310,446 A | 5/1994 | Konishi et al. | |
| 5,354,695 A | 10/1994 | Leedy | |
| 5,371,399 A | 12/1994 | Burroughes et al. | |
| 5,391,510 A | 2/1995 | Hsu et al. | |
| 5,459,346 A | 10/1995 | Asakawa et al. | |
| 5,471,948 A | 12/1995 | Burroughes et al. | |
| 5,557,122 A | 9/1996 | Shrivastava et al. | |
| 5,561,302 A | 10/1996 | Candelaria | |
| 5,565,697 A | 10/1996 | Asakawa et al. | |
| 5,571,741 A | 11/1996 | Leedy | |

(Continued)

OTHER PUBLICATIONS

Horstmann et al., "Sub-50 nm gate length SOI transistor development for high performance microprocessors," 2004, Materials Science and Engineering B 114-115, pp. 3-8.*

(Continued)

*Primary Examiner* — Leonard Chang
(74) *Attorney, Agent, or Firm* — Joseph P. Abate; Roberts Mlotkowski Safran & Cole, P.C.

(57) ABSTRACT

Process for enhancing strain in a channel with a stress liner, spacer, process for forming integrated circuit and integrated circuit. A first spacer composed of an first oxide and first nitride layer is applied to a gate electrode on a substrate, and a second spacer composed of a second oxide and second nitride layer is applied. Deep implanting of source and drain in the substrate occurs, and removal of the second nitride, second oxide, and first nitride layers.

16 Claims, 6 Drawing Sheets

U.S. PATENT DOCUMENTS

| | | | |
|---|---|---|---|
| 5,592,007 A | 1/1997 | Leedy | |
| 5,592,018 A | 1/1997 | Leedy | |
| 5,670,798 A | 9/1997 | Schetzina | |
| 5,679,965 A | 10/1997 | Schetzina | |
| 5,683,934 A | 11/1997 | Candelaria | |
| 5,840,593 A | 11/1998 | Leedy | |
| 5,861,651 A | 1/1999 | Brasen et al. | |
| 5,880,040 A | 3/1999 | Sun et al. | |
| 5,940,736 A | 8/1999 | Brady et al. | |
| 5,946,559 A | 8/1999 | Leedy | |
| 5,960,297 A | 9/1999 | Saki | |
| 5,981,356 A | 11/1999 | Hsueh et al. | |
| 5,989,978 A | 11/1999 | Peidous | |
| 6,008,126 A | 12/1999 | Leedy | |
| 6,025,280 A | 2/2000 | Brady et al. | |
| 6,046,464 A | 4/2000 | Schetzina | |
| 6,066,545 A | 5/2000 | Doshi et al. | |
| 6,090,684 A | 7/2000 | Ishitsuka et al. | |
| 6,107,143 A | 8/2000 | Park et al. | |
| 6,117,722 A | 9/2000 | Wuu et al. | |
| 6,133,071 A | 10/2000 | Nagai | |
| 6,165,383 A | 12/2000 | Chou | |
| 6,221,735 B1 | 4/2001 | Manley et al. | |
| 6,228,694 B1 | 5/2001 | Doyle et al. | |
| 6,246,095 B1 | 6/2001 | Brady et al. | |
| 6,255,169 B1 | 7/2001 | Li et al. | |
| 6,261,964 B1 | 7/2001 | Wu et al. | |
| 6,265,317 B1 | 7/2001 | Chiu et al. | |
| 6,274,444 B1 | 8/2001 | Wang | |
| 6,281,532 B1 | 8/2001 | Doyle et al. | |
| 6,284,623 B1 | 9/2001 | Zhang et al. | |
| 6,284,626 B1 | 9/2001 | Kim | |
| 6,319,794 B1 | 11/2001 | Akatsu et al. | |
| 6,361,885 B1 | 3/2002 | Chou | |
| 6,362,082 B1 | 3/2002 | Doyle et al. | |
| 6,368,931 B1 | 4/2002 | Kuhn et al. | |
| 6,403,486 B1 | 6/2002 | Lou | |
| 6,403,975 B1 | 6/2002 | Brunner et al. | |
| 6,406,973 B1 | 6/2002 | Lee | |
| 6,461,936 B1 | 10/2002 | von Ehrenwall | |
| 6,476,462 B2 | 11/2002 | Shimizu et al. | |
| 6,493,497 B1 | 12/2002 | Ramdani et al. | |
| 6,498,358 B1 | 12/2002 | Lach et al. | |
| 6,501,121 B1 | 12/2002 | Yu et al. | |
| 6,506,652 B2 | 1/2003 | Jan et al. | |
| 6,509,618 B2 | 1/2003 | Jan et al. | |
| 6,521,964 B1 | 2/2003 | Jan et al. | |
| 6,531,369 B1 | 3/2003 | Ozkan et al. | |
| 6,531,740 B2 | 3/2003 | Bosco et al. | |
| 6,621,392 B1 | 9/2003 | Volant et al. | |
| 6,635,506 B2 | 10/2003 | Volant et al. | |
| 2001/0009784 A1 | 7/2001 | Ma et al. | |
| 2002/0074598 A1 | 6/2002 | Doyle et al. | |
| 2002/0086472 A1 | 7/2002 | Roberds et al. | |
| 2002/0086497 A1 | 7/2002 | Kwok | |
| 2002/0090791 A1 | 7/2002 | Doyle et al. | |
| 2003/0032261 A1 | 2/2003 | Yeh et al. | |
| 2003/0040158 A1 | 2/2003 | Saitoh | |
| 2003/0057184 A1 | 3/2003 | Yu et al. | |
| 2003/0067035 A1 | 4/2003 | Tews et al. | |
| 2005/0247986 A1* | 11/2005 | Ko et al. | 257/411 |
| 2007/0122988 A1* | 5/2007 | Luo et al. | 438/303 |

OTHER PUBLICATIONS

Orlowski et al., "Submicron Short Channel Effects Due to Gate Reoxidation induced Lateral Interstitial Diffusion," 1987, IEEE IEDM, pp. 632-635.*

Brand et al., "Intel's 0.25 Micron, 2.0 Volts Logic Process Technology", Intel Technology Journal Q3, 1998, pp. 1-9.*

Kern Rim, et al., "Transconductance Enhancement in Deep Submicron Strained-Si *n*-MOSFETs", International Electron Devices Meeting, 26, 8, 1, IEEE, Sep. 1998.

Kern Rim, et al., "Characteristics and Device Design of Sub-100 nm Strained Si N- and PMOSFETs", 2002 Symposium on VLSI Technology Digest of Technical Papers, IEEE, pp. 98-99.

Gregory Scott, et al., "NMOS Drive Current Reduction Caused by Transistor Layout and Trench Isolation Induced Stress", International Electron Devices Meeting, 34.4.1, IEEE, Sep. 1999.

F. Ootsuka, et al., "A Highly Dense, High-Performance 130nm node CMOS Technology for Large Scale System-on-a-Chip Application", International Electron Devices Meeting, 23.5.1, IEEE, Apr. 2000.

Shinya Ito, et al., "Mechanical Stress Effect of Etch-Stop Nitride and its Impact on Deep Submicron Transistor Design", International Electron Devices Meeting, 10.7.1, IEEE, Apr. 2000.

A. Shimizu, et al., "Local Mechanical-Stress Control (LMC): A New Technique for CMOS-Performance Enhancement", International Electron Devices Meeting, IEEE, Mar. 2001.

K. Ota, et al., "Novel Locally Strained Channel Technique for high Performance 55nm CMOS", International Electron Devices Meeting, 2.2.1, IEEE, Feb. 2002.

* cited by examiner

SPACER AND PROCESS TO ENHANCE THE STRAIN IN THE CHANNEL WITH STRESS LINER

FIELD OF THE INVENTION

The present invention relates to a spacer used to make the stress liner close to the gate.

BACKGROUND DESCRIPTION

Mechanical stresses within a semiconductor device substrate can modulate device performance. That is, stresses within a semiconductor device are known to enhance semiconductor device characteristics. Thus, to improve the characteristics of a semiconductor device, tensile and/or compressive stresses are created in the channel of the NFETs and/or PFETs.

It is known, for example, to provide a patterned and oxidized silicon liner in isolation regions, or spacers on gate sidewalls, to selectively induce the appropriate strain in the channels of the FET devices. By providing patterned oxidized spacers, the appropriate stress is applied closer to the device than the stress applied as a result of the trench isolation fill technique.

While these methods provide structures applying stresses to the devices, they may require additional materials and/or more complex processing, and thus, result in higher cost. In addition, in the methods described above, for example, the stresses in the channel are relatively moderate, which provide only moderate benefit in device performance.

Further, nitride stress liners have been used to improve device performance with enhanced carrier mobility in the channel. The strain induced in the channel by the liner, e.g., nitride, is sensitive to the distance between stress liner and the gate, which is separated by a spacer. However, in an effort to arrange the nitride close to the gate, the spacer is removed.

Further, it is known in the art to utilize two spacers, e.g., a first oxide spacer and a second nitride spacer, and to remove only the second nitride spacer. However, this still disadvantageously results in an oxide spacer of 10-20 nm remaining between the gate and nitride liner. Moreover, another thin oxide layer is below the nitride cover layer which can relax the strain in the channel.

SUMMARY OF THE INVENTION

The invention is directed to a process for enhancing strain in a channel with a stress liner. The process includes applying a first spacer composed of an first oxide and first nitride layer to a gate electrode on a substrate, applying a second spacer composed of a second oxide and second nitride layer, deep implanting source and drain in the substrate, and removing the second nitride, second oxide, and first nitride layers.

According to a feature of the present invention, the gate electrode may be formed by a poly gate etch. Moreover, the first oxide layer can be formed by gate reoxidation, and the first oxide layer can have a thickness of 1-5 nm. The first nitride layer may have a thickness of 10-15 nm.

In accordance with another feature of the invention, the removing of the first and second nitride layers and the second oxide layer can form an L-shaped oxide spacer adjacent the gate electrode spacer, and the process may further include depositing a stress contact liner over the gate and the L-shaped spacer.

According to a further feature of the present invention, the process can include forming suicide (on the gate electrode and the source/drain region) before the removal of the first and second nitride layers and the second oxide layer. Alternatively, the process can include forming silicide after the removal of the first and second nitride layers and the second oxide layer. Further, the removing of the first and second nitride layers and the second oxide layer can include one of a wet etch or a reactive ion etch.

The invention is directed to a spacer for enhancing stain in a channel. The spacer includes a first spacer composed of an first oxide couplable to a gate electrode and first nitride layer coupled to the first oxide layer, and a second spacer composed of a second oxide coupled to the first oxide layer and a second nitride layer coupled to the second oxide layer. The first and second nitride layers and the second oxide layer are removable to form an L-shaped oxide spacer.

The present invention is directed to a process for forming an integrated circuit. The process includes forming a gate electrode on a substrate, forming an L-shaped oxide spacer adjacent the gate electrode, and depositing a stress liner over the gate electrode and the L-shaped spacer.

According to a feature of the present invention, a vertical extent of the L-shaped oxide spacer can have a thickness between 1-5 nm. Further, the L-shaped spacer can be formed by a first oxide/nitride spacer and a second oxide/nitride spacer, in which the second oxide/nitride spacer and the nitride of the first oxide/nitride spacer are removed.

In accordance with the process, the forming of the L-shaped oxide layer may include forming an oxide layer over the gate electrode by reoxidation, depositing a first nitride layer over the oxide layer, forming a first spacer by reactive ion etching (RIE) and then performing an extension/halo implantation. The process also includes depositing a second oxide layer over the first nitride layer, depositing a second nitride layer over the second oxide layer, forming a second spacer by RIE, and removing the second nitride, second oxide, and first nitride layers. Moreover, prior to removing the second oxide and the first and second nitride layers, the process can include deep implanting source and drain in the substrate. The process can also include forming silicide on the gate electrode after the removal of the first and second nitride layers and the second oxide layer, or, alternatively, forming silicide before the removal of the first and second nitride layers and the second oxide layer. The removing of the first and second nitride layers and the second oxide layer can include one of a wet etch or a reactive ion etch.

In accordance with another feature of the invention, the gate electrode may be formed by a poly gate etch.

The present invention is directed to an integrated circuit having a gate electrode formed on a substrate, an L-shaped oxide spacer arranged adjacent the gate electrode, and a stress liner deposited over the gate electrode and the L-shaped spacer.

According to a feature of the invention, a vertical extent of the L-shaped oxide spacer can have a thickness between 1-5 nm. The L-shaped spacer can be formed by a first oxide/nitride spacer and a second oxide/nitride spacer, in which the second oxide/nitride spacer and the nitride of the first oxide/nitride spacer are removed. Further, the L-shaped oxide layer can be formed by removing nitride from an oxide/nitride spacer. A source and drain may be formed through deep implantation in the substrate. Further, silicide can be formed on the gate electrode and source/drain after removing nitride from an oxide/nitride spacer, or silicide can be formed before removing nitride from an oxide/nitride spacer. Moreover, the gate electrode may be formed by a poly gate etch.

DETAILED DESCRIPTION OF THE EMBODIMENTS OF THE INVENTION

A first oxide/nitride spacer is utilized before the halo/extension implant. The oxide layer is formed by reoxidation and can be as thin as 1-5 nm, preferably 1-2 nm. The nitride layer can be removed with a second spacer and before nitride cover layer deposition. In this manner, maximum stain can be induced in the channel to improve device performance.

Strain in the channel of MOSFET is sensitive to the proximity of nitride to the gate. The present invention is directed to a disposable spacer to make the stress liner close the gate, which includes a first spacer, e.g., oxide/nitride, of which the nitride layer is subsequently removed. As a result, the nitride stress liner may only be a few nanometers from the gate, which can increase the strain in the channel.

Figure 1:
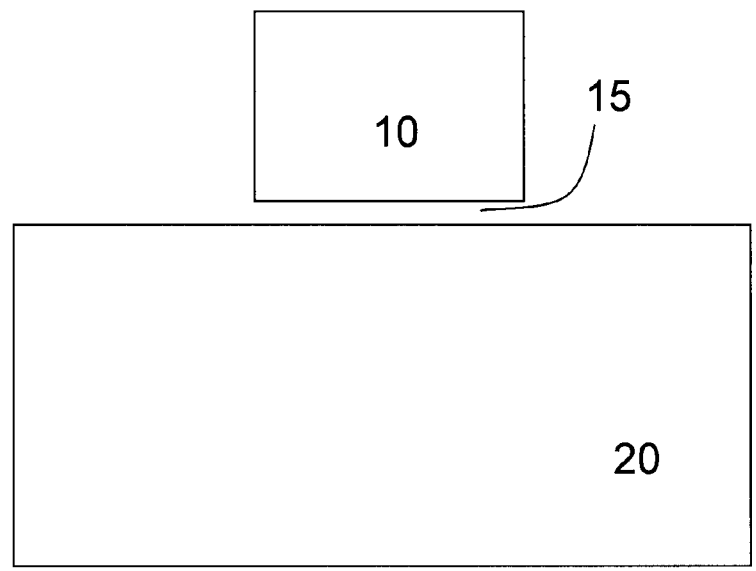
FIGS. 1-9 schematically illustrate process according to a first embodiment of the invention for forming the structure of the present invention.
Figure 2:
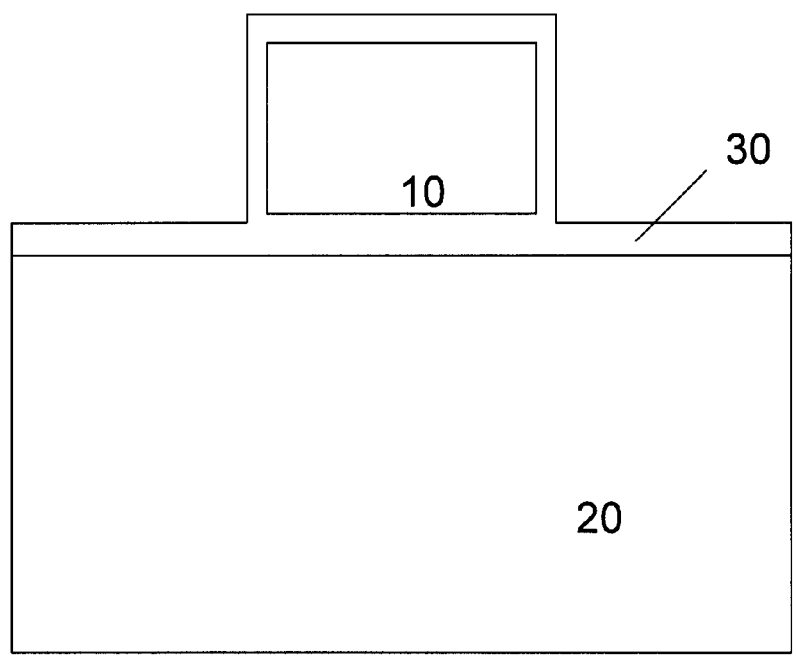
Figure 3:
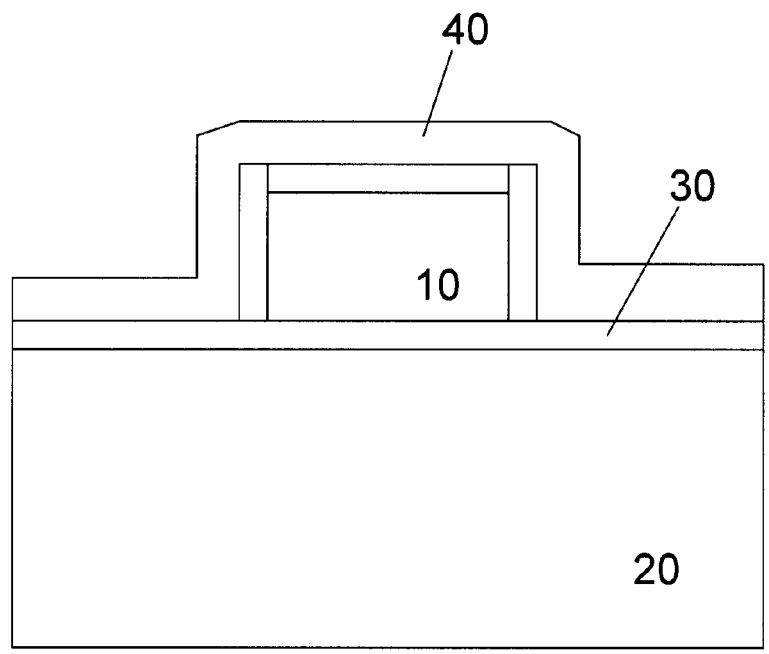
Figure 4:
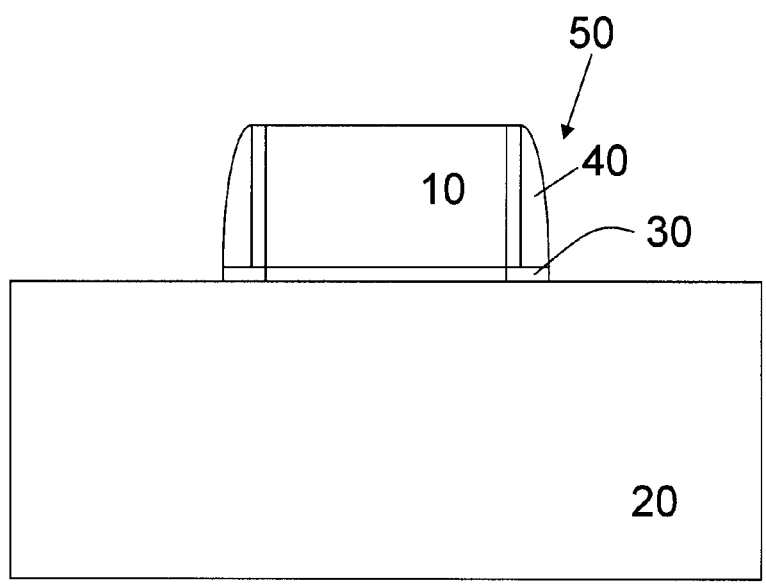

A first embodiment of the invention, illustrated in FIGS. 1-9, enhances strain in the channel with a stress liner. As shown in FIG. 1, a gate 10, e.g., a poly gate, is formed on a substrate 20, e.g., silicon or other suitable material, through a poly gate etch. An insulating layer 15 is formed between gate 10 and substrate 20. In FIG. 2, an oxide layer 30 is formed over gate 10 and substrate 20 to protect gate 10. Preferably, oxide layer 30 has a thickness that generally corresponds to the thickness of insulating layer 15 between gate 10 and substrate 20. Oxide layer 30, e.g., 1-5 nm, can be formed by gate reoxidation. It is noted that, in the prior art, oxide layers protecting the gate have a thickness of 10-20 nm. Subsequently, a nitride layer 40, e.g., 10-15 nm, is deposited over the oxide layer by nitride deposition in FIG. 3. In FIG. 4, portions of the nitride and oxide layers are etched, e.g., via reactive ion etching (RIE) to form first spacers 50 on the sides of gate 10. In this regard, the oxide layer beneath the nitride is etched to extend, e.g., 10-20 nm from gate insulator 15 along substrate 20.

Figure 5:
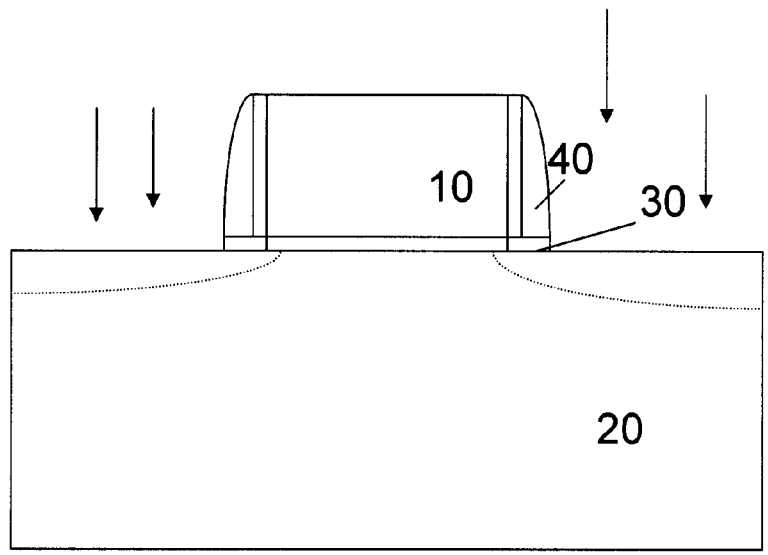
Figure 6:
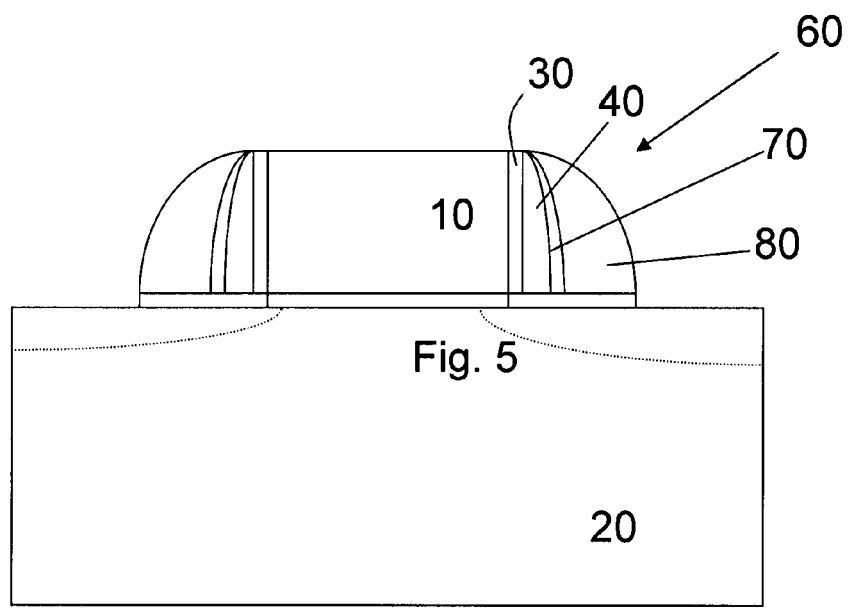

Extension/halo implantation is performed, as is schematically illustrated in FIG. 5, after formation of first spacer 50. After implantation, as illustrated in FIG. 6, a second oxide layer 70 is deposited over first nitride layer 40, and a second nitride layer 80 is deposited over second oxide layer 70. A second spacer 60 is formed by RIE.

Figure 7:
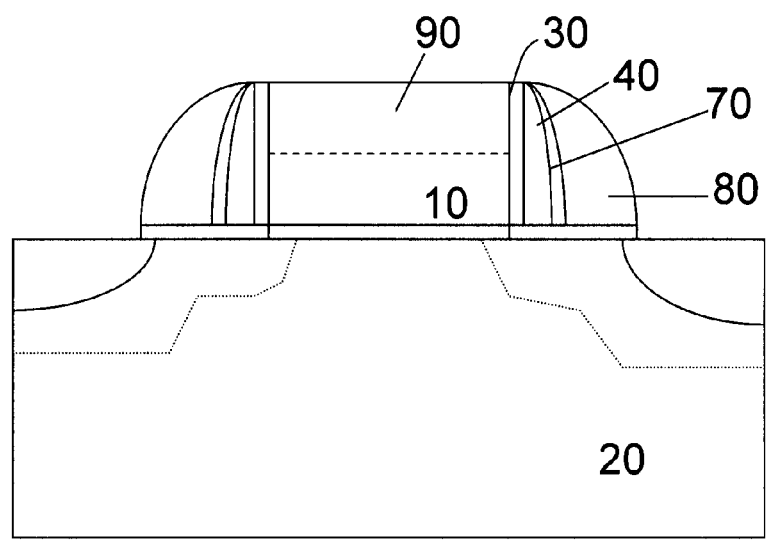
Figure 8:
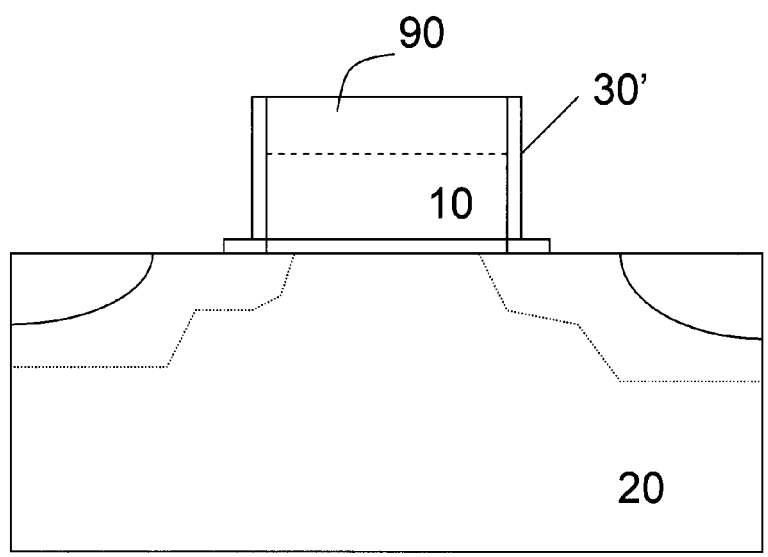

As illustrated in FIG. 7, a deep source/drain implant is performed, as well as a silicide formation 90 in gate 10 and the source/drain region. In FIG. 8, a nitride/oxide/nitride removal, e.g., via wet etch or RIE, is performed. Thus, as shown in FIG. 8, an L-shaped spacer (oxide layer) 30' is formed at the edges of gate 10. In accordance with the invention, L-shaped spacer 30' is significantly thinner than that in the prior art without loss of performance.

Figure 9:
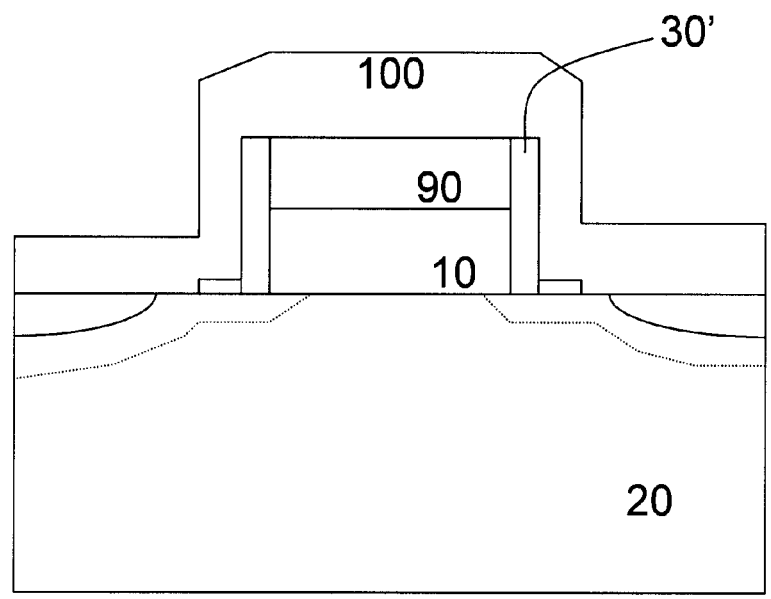

As shown in FIG. 9, a stress liner 100, e.g., a nitride CA (contact) liner, is deposited over gate 10, L-shaped spacer 30', and substrate 20. Because of the significantly thinner construction of L-shaped spacer 30', as compared to the prior art oxide spacer, stress liner 100 is arranged only a few nanometers from gate 10, which increases the strain in the channel.

Figure 10:
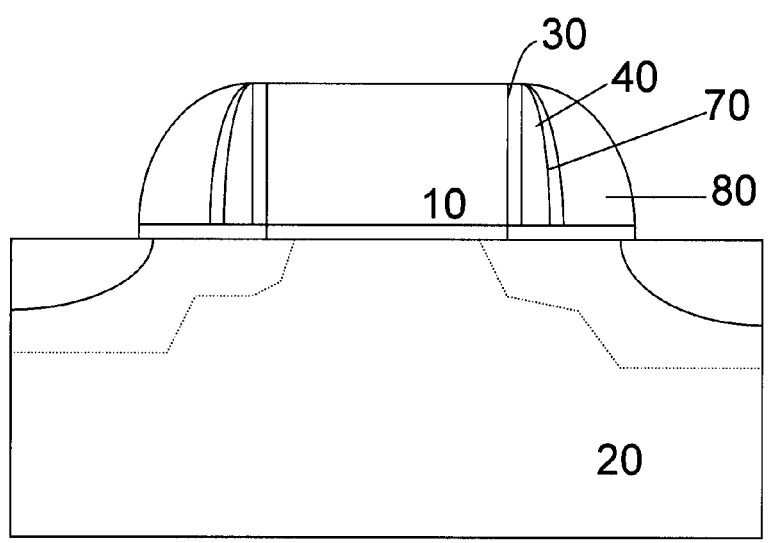
FIGS. 10-12 schematically illustrate a process according to a second embodiment of the invention.
Figure 11:
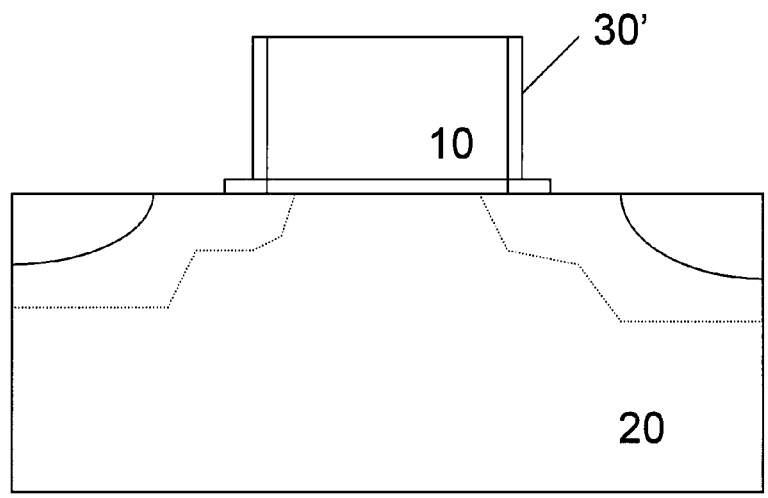
Figure 12:
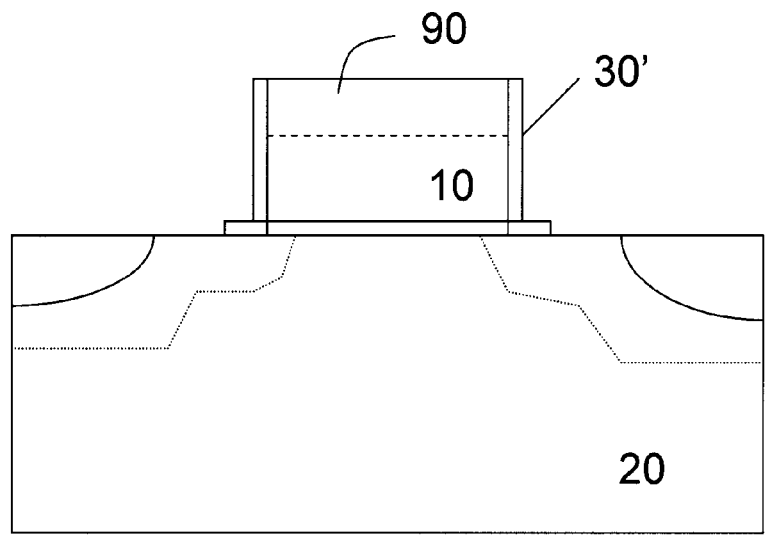

In a second embodiment of the invention, the formation process in accordance with FIGS. 1-6 is performed. Subsequently, as shown in FIG. 10, a deep source/drain implant is performed. However, in contrast to the previous embodiment, silicide formation does not yet occur. In FIG. 11, a nitride/oxide/nitride removal, e.g., via wet etch or RIE, is performed. Thus, as shown in FIG. 11, an L-shaped spacer 30' is formed at the edges of gate 10. FIG. 12 shows a silicide formation 90 on gate 10 and the source/drain region. Thereafter, the process proceeds in accordance with FIG. 9, such that a stress liner 100, e.g., a nitride CA (contact) liner, is deposited over gate 10, L-shaped spacer 30', and substrate 20, whereby stain in the channel is enhanced due to the thin construction of L-shaped spacer 30' separating gate 10 and stress liner 100.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

While the invention has been described in terms of exemplary embodiments, those skilled in the art will recognize that the invention can be practiced with modifications and in the spirit and scope of the appended claims.

What is claimed is:

1. A process for enhancing strain in a channel with a stress liner, comprising:
   applying a first spacer composed of an first oxide and first nitride layer to a gate electrode on a substrate;
   applying a second spacer composed of a second oxide and second nitride layer;
   performing an extension/halo implantation before the applying of the second spacer;
   deep implanting source and drain in the substrate;
   removing the second nitride, second oxide, and first nitride layers to form an L-shaped oxide spacer adjacent the gate electrode; and
   depositing a stress contact liner over the gate and the L-shaped spacer.

2. The process in accordance with claim 1, wherein the gate electrode is formed by a poly gate etch.

3. The process in accordance with claim 1, wherein the first oxide layer is formed by gate reoxidation.

4. The process in accordance with claim 3, wherein the first oxide layer has a thickness of 1-5 nm.

5. The process in accordance with claim 1, wherein the first nitride layer has a thickness of 10-15 nm.

6. The process in accordance with claim 1, further comprising forming silicide on the gate electrode and a source/drain region before the removal of the first and second nitride layers and the second oxide layer.

7. The process in accordance with claim 1, further comprising forming silicide on the gate electrode and a source/drain region after the removal of the first and second nitride layers and the second oxide layer.

8. The process in accordance with claim 1, wherein the removing of the first and second nitride layers and the second oxide layer comprises one of a wet etch or a reactive ion etch.

9. A process for forming an integrated circuit, comprising:
   forming a gate electrode on a substrate;

forming an L-shaped oxide spacer adjacent the gate electrode; and depositing a stress liner over the gate electrode and the L-shaped spacer wherein the forming of the L-shaped spacer comprises forming a first oxide/nitride spacer, performing an extension/halo implantation, forming a second oxide/nitride spacer, and removing the second oxide/nitride spacer and the nitride of the first oxide/nitride spacer.

10. The process in accordance with claim 9, wherein a vertical extent of the L-shaped oxide spacer has a thickness between 1-5 nm.

11. The process in accordance with claim 9, wherein the first oxide layer is formed over the gate electrode by reoxidation, the first nitride layer is deposited over the oxide layer, the second oxide layer is deposited over the first nitride layer, after the extension/halo implantation, and the second nitride layer is depositing over the second oxide layer.

12. The process in accordance with claim 11, wherein prior to removing the second oxide and the first and second nitride layers, the process further comprises deep implanting source and drain in the substrate.

13. The process in accordance with claim 11, further comprising forming silicide after the removal of the first and second nitride layers and the second oxide layer.

14. The process in accordance with claim 11, further comprising forming silicide before the removal of the first and second nitride layers and the second oxide layer.

15. The process in accordance with claim 11, wherein the removing of the first and second nitride layers and the second oxide layer comprises one of a wet etch or a reactive ion etch.

16. The process in accordance with claim 9, wherein the gate electrode is formed by a poly gate etch.

* * * * *